Figure 1A:
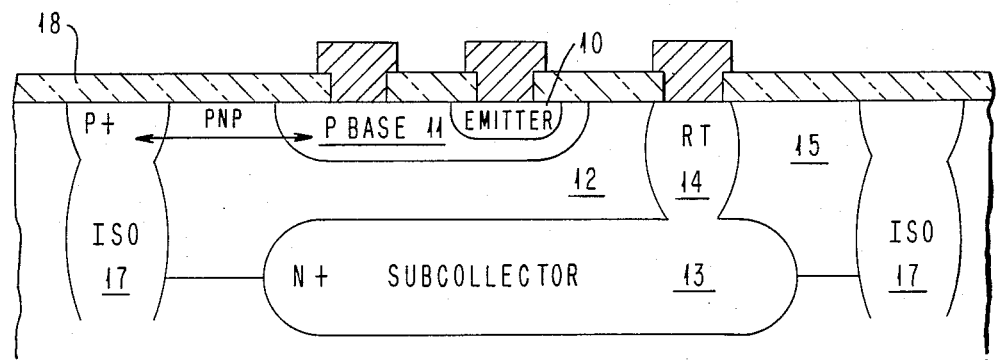

United States Patent [19]

Tremintin

[11] Patent Number: 4,520,448

[45] Date of Patent: May 28, 1985

[54] METHOD OF CHARACTERIZING RELIABILITY IN BIPOLAR SEMICONDUCTOR DEVICES

[75] Inventor: Bernard Tremintin, Orvault, France

[73] Assignee: International Business Machines Corporation, Armonk, N.Y.

[21] Appl. No.: 435,139

[22] Filed: Oct. 18, 1982

[30] Foreign Application Priority Data

Oct. 28, 1981 [FR] France ................ 81 430036

[51] Int. Cl.$^3$ ............... G01R 31/26; G01R 31/02
[52] U.S. Cl. ..................... 364/488; 324/158 T; 364/552
[58] Field of Search ........... 364/488, 489, 490, 491, 364/552; 357/33, 34, 40, 41, 47; 324/158 T, 158 R, 158 D

[56] References Cited

U.S. PATENT DOCUMENTS

| | | | |
|---|---|---|---|
| 3,465,427 | 9/1969 | Barson et al. | 324/158 T |
| 3,889,188 | 6/1975 | Trindade | 324/158 T |
| 3,939,381 | 2/1976 | Meany | 361/402 |
| 4,144,493 | 3/1979 | Lee et al. | 357/50 |
| 4,180,439 | 12/1979 | Deines et al. | 204/1 T |
| 4,281,449 | 8/1981 | Ports et al. | 324/158 R |
| 4,302,875 | 12/1981 | Sator et al. | 29/571 |

OTHER PUBLICATIONS

"Inadequacy of the Classical Theory of the MOS Transistor Operating in Weak Inversion", R. J. Van Overstraeten et al.
IEEE Trans. on Electron Devices, vol. Ed 20, Dec. 1973.
"Advanced Study Institute for IC Design", F. M. Klaasen, Jul. 19–29 1977—Review of Physical Models for MOS Transistor, pub. by Catholic University of Louvain.

Primary Examiner—Errol A. Krass
Assistant Examiner—Donna L. Angotti
Attorney, Agent, or Firm—Francis J. Thornton

[57] ABSTRACT

This invention concerns a method of characterizing the reliability in bipolar semiconductor devices having reliability detracting leakage current due to a parasitic FET transistor between the p-type isolation (source) and base regions (drain) of the bipolar, NPN transistor. The source of this PNP parasitic FET transistor, i.e., the isolation region and the gate are provided with electrodes and the drain region and gate electrodes short-circuited. Then, a reliability function R is determined as equal to the product $N_{SS} \times N_{eff} \times N_D^{\frac{1}{2}}$, wherein $N_{SS}$, is the interface charge density, $N_{eff}$ is the oxide charge density, and $N_D$, is the impurity concentration in the epitaxial layer. This function is correlated with the time-to-fail, such as, for instance, $T_{50}$. It suffices to characterize the manufacturing line beforehand by plotting curve $R = f(T_{50})$; to this end, the reliability functions and their respective times-to-fail after a burn-in step, are measured for different batches of wafers. Then, it suffices to measure the reliability function for any given batch and to deduce therefrom, according to the curve, the time-to-fail, directly. Such a method makes it possible to save time on the pilot lines while a novel bipolar semiconductor product is being developed, and to have a very rapid reaction time on the manufacturing lines, when such a reliability defect occurs.

4 Claims, 6 Drawing Figures

METHOD OF CHARACTERIZING RELIABILITY IN BIPOLAR SEMICONDUCTOR DEVICES

DESCRIPTION

This invention relates generally to semiconductor integrated circuits and, more particularly to a method of characterizing the reliability of bipolar semiconductor devices manufactured with the help of a selected technology.

In brief, silicon chips show two types of defects, once the entire manufacturing cycle has been completed; immediate defects, detected during the various manufacturing steps or during the final electrical test such as, for instance, when a metallic lead is cut or when a base region is short-circuited and other so-called reliability defects which can be detected only after when the chips have already been operated, such as, for instance, the well-known phenomenon of the electromigration of the aluminium grains through the aluminium stripes, which entails the splitting of the overlaying silica layer. These reliability defects raise a big problem since they necessitate repair of machines already installed.

From amongst the reliability defects, those resulting from instabilities in the passivation oxide, are not well known. These instabilities, however, have an important part in the reliability defects of the bipolar semiconductor devices. They occur in the form of a leakage current which is produced between two P-type regions in an epitaxial N-type layer.

Unfortunately, such a parasitic PNP structure which is found very frequently in bipolar devices (more particularly, between the base region and the isolation region), is a significant cause of reliability defects. Therefore, it is desirable to accelerate the full development of these reliability defects which are time-dependent, and to find them out before selling the chips.

To this end, the manufactured chips are mounted upon ceramic substrates in a known way in order to form electronic modules. These modules are, then, mounted upon cards which include additional circuits and fulfill the functions of measuring a number of parameters. The cards are subject to "constraints", i.e., they are introduced into an oven wherein voltages are applied thereto, which can be the different nominal operating voltages of said modules (this process is the so-called "burn-in" process). The temperature of the oven and the length of time the operation is carried out is a function of the nature of the chips. The operation can be carried out over time periods in the order of 1000 hours (three weeks), which are quite normal. At determined time intervals (every 24 hours, for instance) a group of modules is removed from the oven, its operating state is checked; the time-to-fail thereof is defined as the time necessary for a failure to occur. If, for instance, after 500 hours spent in the oven, 50% of the modules are deficient, the time-to-fail $T_{50}$ is said to be 500 hours.

This way of proceeding is slow (the information is available only after several days or weeks) and tedious (the chips have to be mounted upon a module and special supporting cards have to be created for a given application, which are unuseful in other applications). The reaction time is long and, therefore, it is a long time before the defect can be corrected, which leads to the manufacturing of a considerable quantity of deficient chips (which are then unusefull), which increases the manufacturing cost.

Therefore, the semiconductors industry has a need for method of characterizing the reliability of bipolar devices which, preferably, is carried out at the chip level and not at the module level, and wherein the burn-in step is not necessary (thus eliminating the creation of special cards and extremely long time lengths).

This invention proposes to solve this problem, by establishing a correlation between some of the so-called prevailing or predominant, parameters from amongsts the electrical parameters which are characteristic of the charges in the oxide, gathered into a reliability function R, and the reliability results given in the form of a time-to-fail, such as, for instance, $T_{50}$. These instability phenomena appear to result essentially from two parameters, namely, the number of the charges in the oxide and the interface state density.

These two prevailing parameters which are present in function R are measured at the chip level at the end of the semiconductor processing operation, on a test structure of the isolated gate field effect transistor type IG-FET.

The test structure is simple in its construction and this is one of the advantages of this invention; it is comprised of a parasitic PNP transistor, such as mentioned above, which is utilized as a FET transistor, the isolation region acting as the source, the base region acting as the drain and the base contact as the gate electrode.

The method of this invention which determines directly and rapidly the time-to-fail (such as, for instance, $T_{50}$) by means of simple electrical measurements, includes first the steps of characterizing the manufacturing line under consideration. These steps are as follows, namely, forming bipolar semiconductor devices having at least one FET type test structure thereon; calculating, for each of the selected devices, one reliability function R substantially equal to the product of $N_{SS} = N_{eff}$, wherein $N_{SS}$, is the interface charge density and $N_{eff}$, is the oxide charge density. Determining the time-to-fail T ($T_{50}$, for instance) for these devices; plotting a curve R=f(T) (R=f($T_{50}$), for instance); and finally calculating for any other device on the manufacturing line, the function R thereof, and determining directly the time-to-fail thereof ($T_{50}$, for instance given by curve R=f($T_{50}$).

This invention considers the substantial influence of the impurity concentration in the epitaxial layer $N_D$, and notes that the optimum reliability function is, as a matter of fact, given by the relation $R = N_{SS} \times N_{eff} \times N_D^{\frac{1}{2}}$.

Figure 1B:
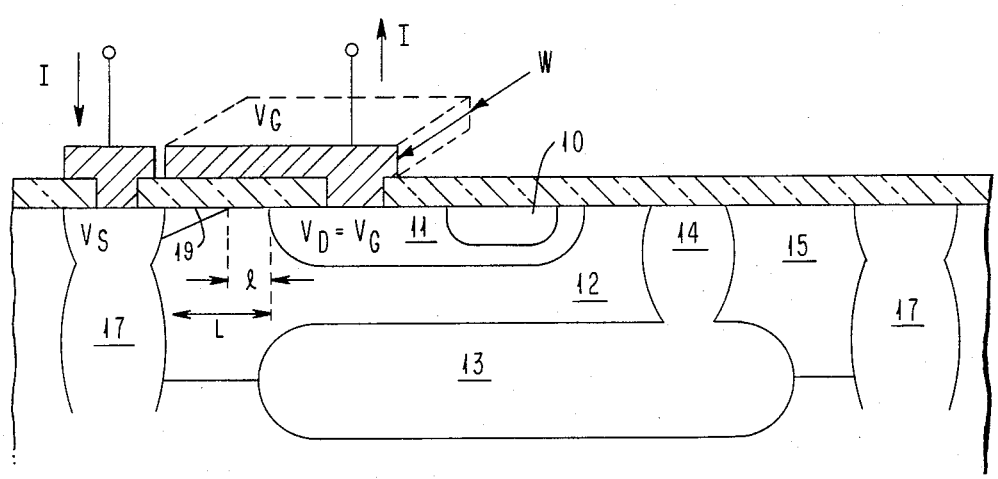
Figure 2A:
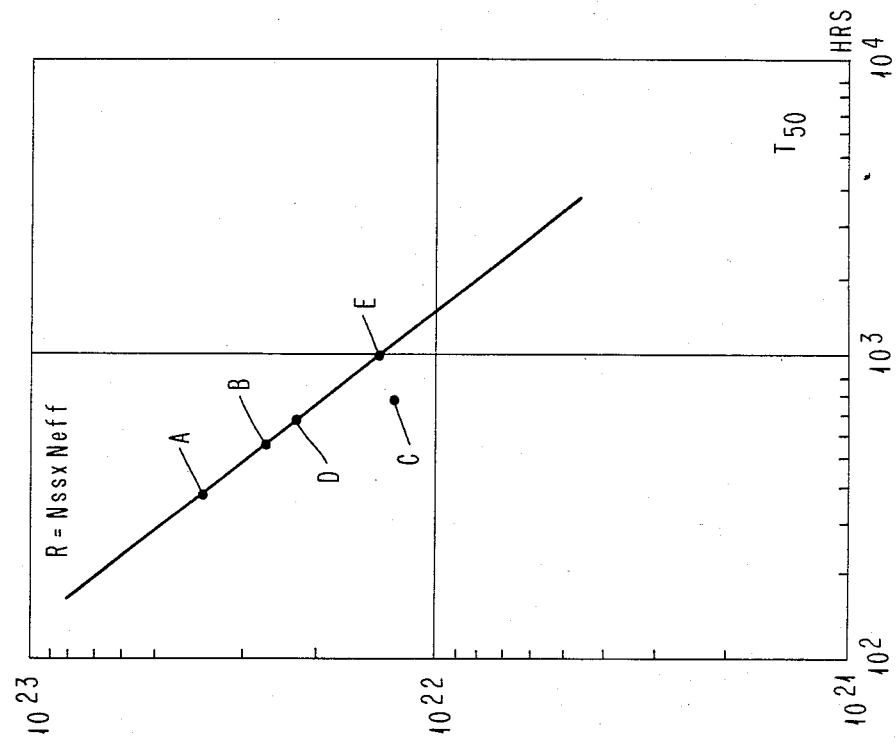
Figure 2B:
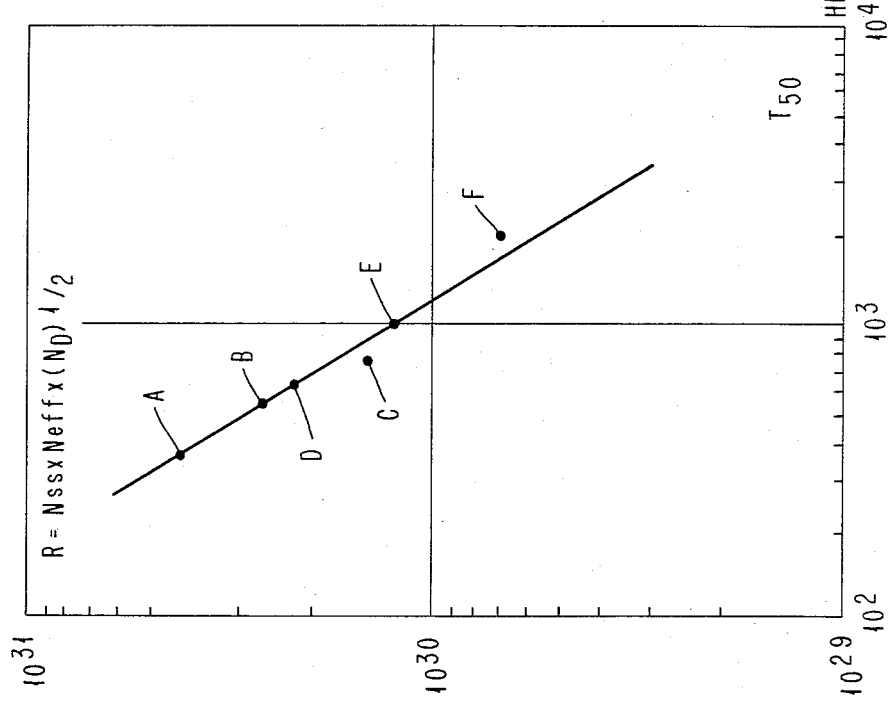
Figure 3:
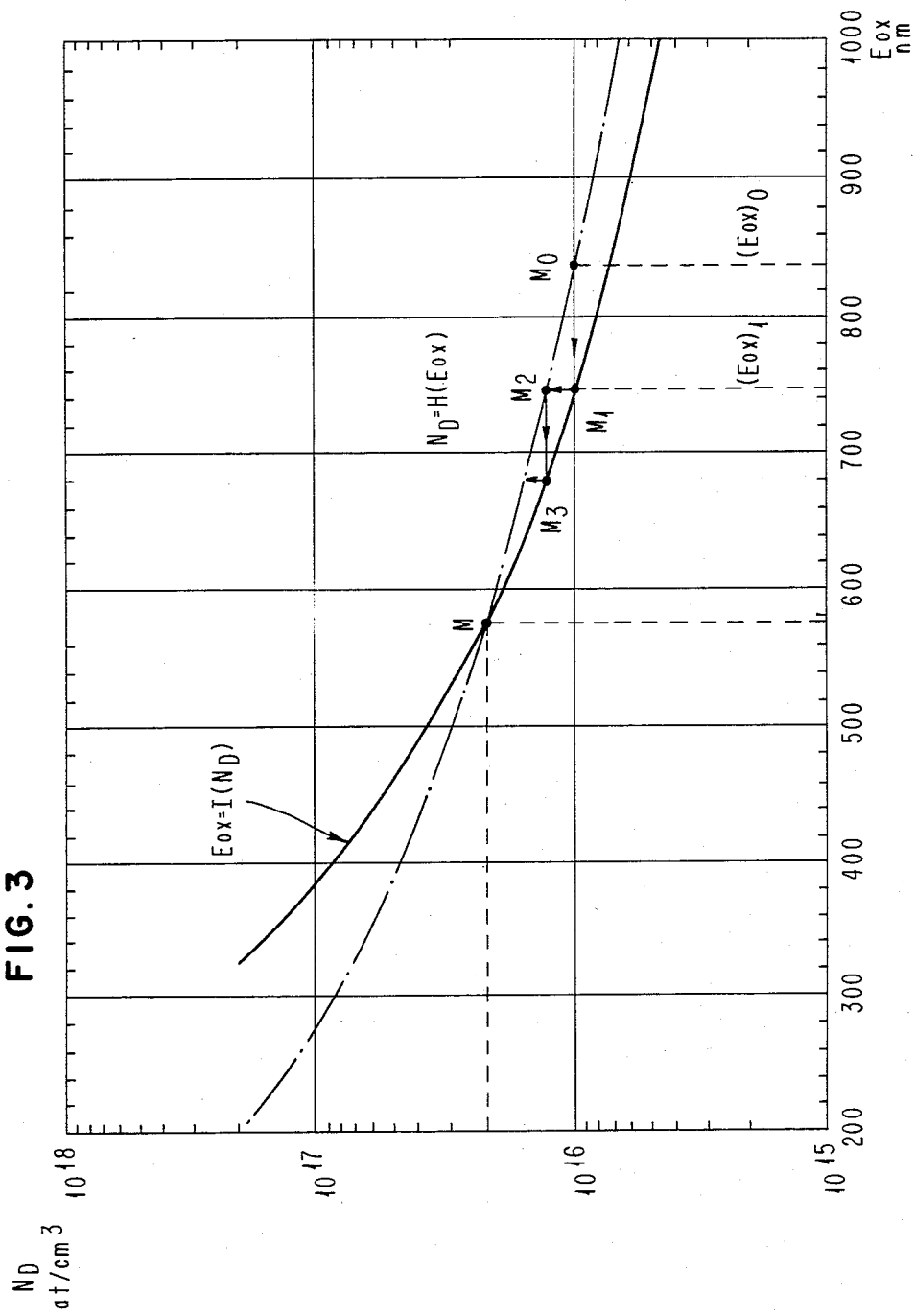
Figure 4:
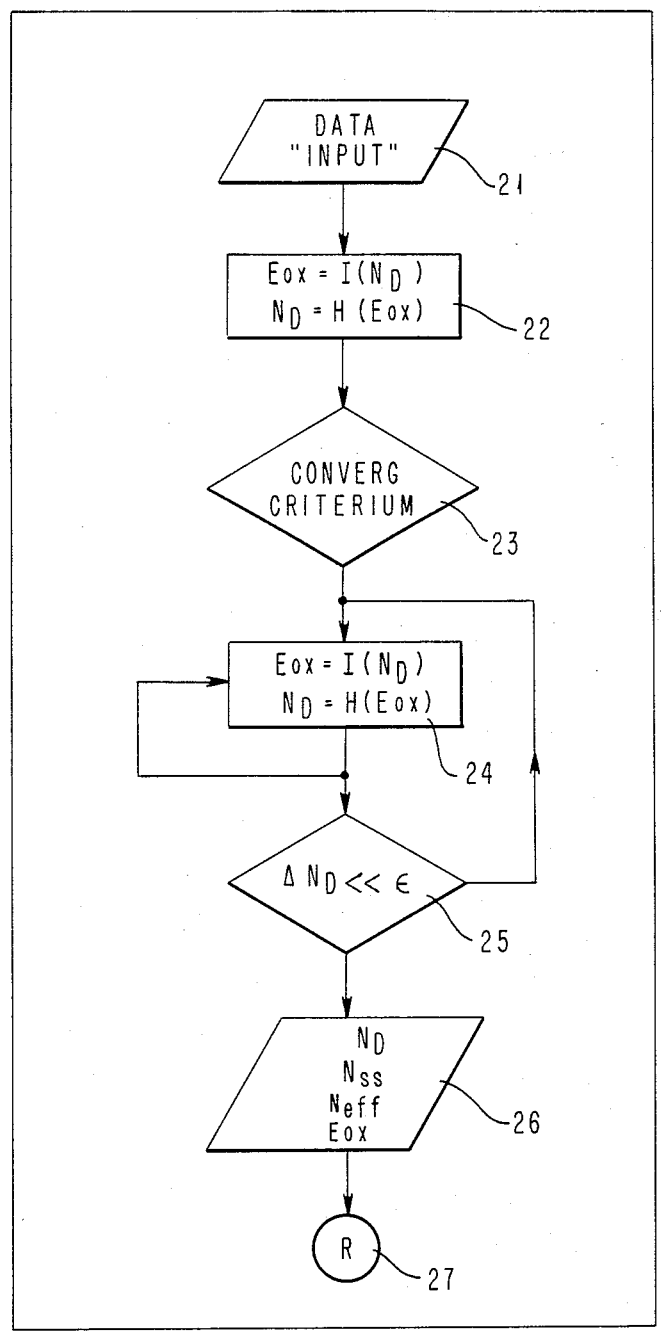

This invention will be further discussed by way of a non limiting example and with reference to the accompanying drawings, wherein:

FIG. 1A, depicts a conventional bipolar NPN transistor structure which shows the presence of a parasitic PNP transistor between the isolation region and the base region, FIG. 1B, is the same structure but with a different metallization forming a p channel FET transistor, FIG. 2A illustrates the variation in the reliability function in terms of the time-to-fail $T_{50}$, expressed in hours, when $R = N_{SS} \times N_{eff} \times N_D^{\frac{1}{2}}$, ($N_{SS}$, is the interface charge density, $N_{eff}$, is the oxide charge density, and $N_D$, is the atom/cm$^3$ concentration in the epitaxial layer, FIG. 2B illustrates the variations in the reliability function R in terms of the time-to-fail $T_{50}$, expressed in hours, when $R = N_{SS} \times N_{eff}$, FIG. 3 illustrates curves $E_{ox} = I(N_D)$ and $N_D = H(E_{ox})$, where $E_{ox}$ is the thickness of the passivation oxide layer, expressed in nanometers, and FIG. 4, is a block diagram for the computation of the prevailing parameter in the reliability function R is an automatic processing application.

FIG. 1A illustrates a conventional bipolar NPN transistor with its emitter region 10, base region 11 and collector region 12, its subcollector 13 and reach-through region 14, formed in a pocket 15 in the epitaxial layer isolated by isolation region 17. As mentioned above, the reliability deficiency results from a leakage current which is produced between two P-type regions, for example regions 11 and 17, i.e., a parasitic transistor. Various observations revealed that this leakage current has been caused by instabilities in the charge of the passivation oxide 18. In order to understand the phenomenon of instabilities in the oxide, a theoretical survey of the phenomenon and the setting out of all the parameters involved in this instability phenomenon, have been effected (it is the subject-matter of part I), and then, through an empirical and systematical survey, a correlation between some of these prevailing parameters with the time-to-fail the time T ($T_{50}$, for instance) has been established, (it is the subject matter of part II). In part III of this disclosure, the method of computing these prevailing parameters is detailed. Finally, the industrial implementation of the invention is described in part IV.

I. Theoretical Survey of the Instability Phenomenon

In practice, a FET structure such as that shown in FIG. 1B, can be utilized. Such a structure always exists when a bipolar transistor is connected, a P-channel FET transistor is obtained from a bipolar NPN transistor, the source is formed of the upper isolation region 17, the drain formed of the base region 11 of the NPN transistor and the surface 19 of the collector layer 12 between these regions constitutes the channel. The metallization connects gate to drain and makes $V_G = V_D$. The FET transistor shown in FIG. 1B is the test structure. The only requirement is that the threshold voltage $V_T$ of the FET transistor be lower than the breakdown voltage of the base-collector junction, in order to make the measurements possible.

In order to obtain a complete characterization of the oxide, it is advisable to understand, first, the nature of the different charges, that are involved.

The leakage current which appears between the two P regions 11 and 17 seems to result from the presence of charges induced in the silicon surface 19. This means that it can be created by mobile charges in the oxide or by an injection of carriers from the silicon. A negative charge, however, is necessary at the Si—SiO$_2$ interface to create a conducting path through the silicon.

Such a condition may occur when negative mobile ions in the oxide are moving to the interface during the burn-in step; when immobile negative ions, neutralized by positive mobile ions, are moving from the interface, leaving a negative charge; when electrons from the silicon are injected into the oxide and are trapped in the oxide.

Many experiments have proved that the inversion phenomenon affecting the epitaxial N region 12 (which creates the leakage current) is not in the transfer of the positive or negative mobile charges. It has been shown that the silicon electrons are injected during the burn-in step and that these electrons when trapped in the vicinity of the interface, are essentially the cause of the leakage current.

Finally, a conclusion has been drawn that the leakage current does not depend on the physical parameters of the oxide (density, quality, etc.) but on the electrical parameters $N_{eff}$ (charge density in oxide), $N_{SS}$ (interface state density) and $N_D$ (epitaxial layer impurity concentration), the hereafter so-called predominant or prevailing parameters which are the only ones that characterize the electronic current which is created during the burn-in step (comprised of the diffusion current, the interface recombination current, the silicon electron injection current into the oxide, which is created through electron injection and tunnel effect) as well as the trapping of the electrons in the oxide (which is a function of the number of traps, etc.).

II. Establishment of a Correlation

No correlation between each of these three parameters $N_{eff}$, $N_{SS}$ and $N_D$ which characterize the leakage current and the reliability results, has been found. After a systematical survey, effected by comparing the burn-in processing data and the FET characterizing results, a very good correlation, however, has been established between the time-to-fail T ($T_{50}$, for instance) and the prevailing parameters, namely, the interface state density $N_{SS}$, the oxide charge density $N_{eff}$) and the square root of the epitaxial layer impurity concentration $N_D$. In five different batches of slices, numbered from A to E, the parameters $N_D$, $N_{eff}$ and $N_{SS}$ have, first, been measured by means of a computing mode which will be further detailed in part III of the disclosure, and the results have been gathered in the following table:

| Batch No. | $N_D$ Cm$^{-3}$ | $E_{ox}$ nm | $N_{eff}$ cm$^{-2}$ | $N_{ss}$ eV$^{-1}$ cm$^{-2}$ |
|---|---|---|---|---|
| A | 1.1 10$^{16}$ | 760 | 2.5 10$^{11}$ | 1.55 10$^{11}$ |
|   | 1.1 10$^{16}$ | 685 | 2.4 10$^{11}$ | 1.1 10$^{11}$ |
|   | 9.2 10$^{15}$ | 790 | 1.1 10$^{11}$ | 6.5 10$^{10}$ |
|   | 8.5 10$^{10}$ | 770 | 2.15 10$^{11}$ | 9.3 10$^{10}$ |
| B | 1.1 10$^{16}$ | 650 | 2.6 10$^{11}$ | 1.1 10$^{11}$ |
|   | 1.4 10$^{16}$ | 560 | 3.3 10$^{11}$ | 1.2 10$^{11}$ |
| C | 1.5 10$^{16}$ | 710 | 1.7 10$^{11}$ | 7.2 10$^{10}$ |
|   | 1.45 10$^{16}$ | 735 | 1.6 10$^{11}$ | 6.7 10$^{10}$ |
|   | 1.55 10$^{16}$ | 690 | 2 10$^{11}$ | 6.5 10$^{10}$ |
| D | 1.15 10$^{16}$ | 595 | 2.7 10$^{11}$ | 7.9 10$^{10}$ |
| E | 6.6 10$^{15}$ | 880 | 1.8 10$^{11}$ | 6.5 10$^{10}$ |
|   | 7.6 10$^{15}$ | 910 | 1.7 10$^{11}$ | 8.1 10$^{10}$ |
|   | 7.4 10$^{15}$ | .815 | 2.2 10$^{11}$ | 7.7 10$^{10}$ |
|   | 8.6 10$^{15}$ | 740 | 1.9 10$^{11}$ | 6.9 10$^{10}$ |

The slices, then, have been subject to burn-in ageing steps which have been detailed above, and $T_{50}$ has been measured for each of these batches. In FIG. 2A, the X-axis indicates the product of the reliability function $R = N_{SS} \times N_{eff} \times N_D^{\frac{1}{2}}$ and the Y-axis indicates the different times-to-fail $T_{50}$. This figure shows off the excellent correlation which exists between the reliability functions and the reliability results, as clearly illustrated by curve 2A.

FIG. 2B illustrates the reliability function $R' = N_{SS} \times N_{eff}$ which implies only the charge trapping phenomenon and which, therefore, does not consider the epitaxial layer doping concentration ($N_D$). This function provides slightly lower results, more specifically for batch C.

III. Prevailing Parameters Computing Mode

For a complete characterization of the oxide, two series of measurements have been effected. They are illustrated by curves $I_D - V_G$ which show the weak inversion and the strong inversion, respectively.

(a) under weak inversion: determination of $N_{SS}$.

First, the test FET transistor shown in FIG. 1B has its threshold voltage $V_T$ measured and this transistor is then biased at a voltage slightly smaller (such as, for instance, two volts). The equations which give the behaviour of the FET transistor, under weak inversion, are known in the art. for instance, reference can be made to the article: "Inadequacy of the Classical Theory of the MOS Transistor under Weak Inversion" by R. J. Van Overstraeten et al, IEEE Trans. On Electron Devices, Vol. ED 20, December 1973. When $\eta$ is indicative of the slope of the curve $I_D - V_G$, so that $$\eta = \frac{d(\text{Log } I_D)}{dV_G} \quad (1)$$

$$\eta = \frac{\frac{q}{KT} \times C_{ox}}{C_{ox} + C_{si} + C_{ss}}$$

can be deduced from this article, an expression wherein $C_{ox}$, is the equivalent oxide capacitance, and $C_{ss}$, is the interface capacitance which is related to the interface charge density $N_{ss}$ by expression:

$$C_{ss} = qN_{ss} \text{ (by unity of surface)} \quad (2)$$

and $C_{si}$ is the interface capacitance when FET is under inversion. K is Boltzman's constant and T is temperature. When combining (1) and (2), $C_{ss}$ is eliminated and there is obtained:

$$N_{SS} = \frac{C_{ox}}{\eta KT} - \frac{1}{q}(C_{ox} + C_{si}) \quad (3)$$

In this expression $\eta$ (measured value of the slope), k, q and T are known, $C_{ox}$ is directly related to $E_{ox}$, the equivalent thickness of the oxide, and $C_{si}$ is directly related to the impurity concentration in the epitaxial layer surface $N_D$, i.e.:

$$N_{SS} = \frac{\epsilon_{ox}}{\eta E_{ox} kT} - \left( \frac{1}{q} \left( \frac{\epsilon_{ox}}{E_{ox}} + \frac{U_S}{|U_S|} \times \frac{\sqrt{\epsilon_{si}} \times \sqrt{qN_D\beta} \times N_D}{2\sqrt{2} \, n_i \sqrt{(\text{Log } N_D/n_i - 1)}} \right) \right) \quad (4)$$

with
$n_i$ = the silicon intrinsic concentration, and
$U_S$ = the surface potential.
In other words:

$$N_{SS} = F(E_{ox}, N_D) \quad (5)$$

$E_{ox}$ and $N_D$ will be calculated from curves $I_D - V_G$, under saturation. The terms "equivalent oxide capacitance" $C_{ox}$ and "equivalent oxide thickness" $E_{ox}$ are used in the case when the passivation layer is not a single $SiO_2$ layer, but a composite $SiO_2/Si_3N_4/SiO_2$ layer.

(b) under strong inversion and saturation

The FET transistor is biased so that it is under a strong inversion, i.e., under saturation. The equations which govern the behaviour of the FET transistor, under those conditions, can be found in the following reference: N.A.T.O.: "Advanced Study Institute for IC Design" July 19–29, 1977, F. M. Klaasen—Review of Physical Models for MOS Transistor, published by the Catholic University of Louvain. The threshold voltage $V_T$, under saturation $V_{TS}$, is given by the relation:

$$V_{TS} = V_S + 2\phi_F + \phi_{ms} - \frac{Q_{ox}}{C_{ox}} - K\sqrt{(-V_S - 2\phi_F)} \quad (6)$$

an expression wherein $V_S$, is the potential of the source region, $\phi_F$ is the Fermi level at equilibrium, $\phi_{ms}$, is the metal-silicon work function, $Q_{ox}$, is the equivalent oxide charge, and k is a known coefficient so that:

$$K = \frac{\sqrt{2q\epsilon_{si}N_D}}{C_{ox}} \quad (7)$$

where $\epsilon_{si}$ is the silicon permittivity.

When making two measurements on the threshold voltages $V_{TS1}$ and $V_{TS2}$ corresponding to two determined different source region biases $V_{S1}$ and $V_{S2}$, and when carrying out $V_{TS2} - V_{TS1}$, K is computed, namely:

$$K = \frac{(V_{TS2} - V_{TS1})(V_{S2} - V_{S1})}{\sqrt{(-V_{S1} - 2\phi_F)} - \sqrt{(-V_{S2} - 2\phi_F)}}$$

Then, $Q_{ox}$ is deducted from (6) knowing that $Q_{ox} = qN_{eff}$ whence, $$N_{eff} = C_{ox}/q \, (V_{S1} + 2\phi_F + Q_{ms} - V_{TS1} - k\sqrt{(-V_{S1} - 2\phi_F)}) \quad (8)$$

$N_{eff}$ is a function of $E_{ox}$ (through $C_{ox}$) and of $N_D$ through K); therefore, there can be written:

$$N_{eff} = G(E_{ox}, N_D) \quad (9)$$

but, from (7), it is known that:

$$K = \frac{\sqrt{2q\,\epsilon_{si}N_D}}{C_{ox}} \text{ whence } N_D = \frac{K^2 C_{ox}^2}{2q\,\epsilon_S} \quad (10)$$

i.e., $N_D = H(E_{ox})$ (11)

It should be noted that $N_D$ is a parameter of the method and that, as a rule, it is known from the specification. The only purpose of such a measurement is for a more specific determination.

The problem consists in determining $E_{ox}$. The equivalent oxide thickness $E_{ox}$ is calculated from slope s of curve $I_D - V_G$ under saturation, i.e., from $I_D = s^2(V_G - V_T)^2$. It is known from the teachings by Klaasen that:

$$s^2 = \frac{\beta}{2(\gamma + 1)} \qquad (12)$$

with $$\beta = \frac{\mu_p \epsilon_{ox} W}{E_{ox}(L - l)} \qquad (13)$$

and $$\gamma = \frac{K}{2\sqrt{(-V_S - 2\phi_F)}} = \frac{\sqrt{2q\epsilon_{si}N_D}}{2\epsilon_{ox}\sqrt{-V_S - 2\phi_F}} \times E_{ox} \qquad (14)$$

Expressions wherein $\epsilon_{ox}$, is the oxide permittivity, $\epsilon_{si}$, is the silicon permittivity, $\mu_p$, is the hole mobility, W and L are the width and length of the FET device, respectively (see FIG. 1B).

Values W and L are determined from an optical measurement, and l is determined by the computating operation.

The value of $E_{ox}$ is drawn from equations (12), (13), and (14)

$$E_{ox} = \frac{\mu_p \epsilon_{ox}^2 W}{(L-l)} \frac{\sqrt{-V_S - 2\phi_F}}{[\sqrt{2q\epsilon_{si}N_D} \; E_{ox}] 2\epsilon_{ox} \sqrt{-V_S - 2\phi_F}} \qquad (15)$$

That is to say, the value of $E_{ox}$ is given in terms of $N_D$ namely:

$$E_{ox} = I(N_D) \qquad (16).$$

In brief, two equations have been obtained from the characteristics $I_D - V_G$ under saturation, one from measurements on the threshold voltage under saturation, which gives:

$$N_D = H(E_{ox}) \qquad (11),$$

and one from the slope of the curve $I_D - V_G$ under saturation, which gives:

$$E_{ox} = I(N_D). \qquad (12).$$

FIG. 3 illustrates, in a particular embodiment, the shapes of the curves; the intersection of curves H and I gives solutions $E_{ox}$ and $N_D$ (in the case illustrated in FIG. 3, $E_{ox} \neq 570$ nm and $N_D \neq 2,210^{1616}$ atoms/cm$^3$). The values found from $E_{ox}$ and $N_D$ are introduced into equation (8), which leads to the determination of $N_{eff}$, and into equation (4), which leads to the determination of $N_{SS}$.

FIG. 4 illustrates in a block diagram the computation of the prevailing parameters of the reliability function R, namely, $N_{eff}$, $N_D$ and $N_{SS}$. Block 21 is meant for all the data at the start which result from direct measurements both electrical (($V_{TS1}$, $V_{TS2}$, $V_{S1}$, $V_{S2}$, $\eta$, s ...) and optical (W, L) that are elaborated in order to constitute the work data basis. Block 22 is meant for the plotting of functions $E_{ox} = I(N_D)$ and $N_D = H(E_{ox})$. Then, through successive iterations, one tries to approximate those values $N_D$ and $E_{ox}$ which correspond to the coordinates of point M (FIG. 3). To this end, value $N_{Do}$ provided by the manufacturing specifications is utilized, which provides an approximate value of $N_D$, with the help of curve $N_D = H(E_{ox})$, point M0 is found, which provides value $(E_{ox})_o$, which, in its turn, provides M1.

Beforehand, one makes sure that points M0, M1, ..., are converging to point M. Block 23 is meant for that. Block 24 is meant for further computation of successive iterations M0, M1, M2, ... M$_n$, until the required accuracy is reached (block 25). The results, i.e., the values $N_D$, $N_{SS}$, $N_{eff}$ and $E_{ox}$ are available in block 26, and the value of the reliability function R is available in block 27. The block diagram illustrated in FIG. 4 can be used as a basis for the implementation of a automatic data processing program.

IV. Industrial Application

On an industrial basis, the characterization method is implemented as follows:

First, a given manufacturing line is characterized by calculating function R for two (or more) different batches of wafers and, after a burn-in step, the corresponding times-to-fail $T_{50}$ are calculated. Curve $R = f(T_{50})$ is plotted. Then, for a determined batch, it suffices to calculate its reliability function R1 and to deduce its corresponding time-to-fail $(T_{50})_1$, directly from curve $R = f(T_{50})$, thereby avoiding the complex and time-consuming burn-in operations.

Therefore, this method has a considerable interest for both the pilot lines used in advanced technology, since much time is saved in the development of a novel semiconductor product, and the manufacturing lines, since it is possible to react rapidly to a possible reliability defect which can be first selected and then corrected. It results therefrom that the quantity of the thus-manufactured deficient slices is significantly reduced.

By way of an example, with this characterization method, it has been possible to detect rapidly autodoping defects in P regions, or else, registration defects in the upper P-type isolating regions. Still more, it has been detected that the conventional annealing step at 400° C. during 25 minutes carried out after aluminum conductors have been formed, at the end of the process, is profitable only when carried out in an hydrogen atmosphere. Indeed, there have been obtained the following results:

|  | $N_{eff}$ | $N_{SS}$ | $N_D$ | $E_{ox}$ nm |
|---|---|---|---|---|
| Conventional annealing step | $1.8 \; 10^{11}$ | $7.2 \; 10^{10}$ | $9.5 \; 10^{15}$ | 750 |
| H$_2$ annealing step | $1.4 \; 10^{11}$ | $5.5 \; 10^{10}$ | $9 \; 10^{15}$ | 780 |

The conventional product corresponds substantially to batch C in FIG. 2A whereas the product after its being subject to an annealing step in an hydrogen atmosphere, is indicated by F in the same figure, and has a 2000 hour time-to-fail $T_{50}$. Therefore, this improvement has been detected immediately, the commutation of the reliability function being carried out rapidly owing to the above-disclosed computation technique (part III and FIG. 4). This variation in the annealing step has been immediately implemented on the manufacturing line.

What is claimed is:

1. A method of characterizing reliability in bipolar semiconductor devices manufactured in a selected line, by means of a determined technology, characterized in that it includes the steps of:

forming bipolar semiconductor devices comprising at least one test structure of the FET type, in said manufacturing line, selecting a plurality of said devices, each having an interface charge density, an oxide charge density and an equivalent thickness of the oxide, computing for each of the selected devices, from the test structure, a reliability function R substantially equal to product $N_{SS} \times N_{eff}$, wherein $N_{SS}$, is the interface charge density, and $N_{eff}$, is the oxide charge density, determining the time-to-fail T after a selected time $T_{50}$, for said selected devices, plotting curve $R = f(T)$, and calculating, for any other device produced in the selected manufacturing line, its function R, and predicting its time-to-fail at time $T_{50}$, by means of curve $R = f(T_{50})$.

2. A method according to claim 1, characterized in that function R is chosen equal to product $N_{SS} \times N_{eff} = N_D^{\frac{1}{2}}$, wherein $N_D$ is the impurity concentration in the epitaxial layer.

3. A method according to claim 1 characterized in that said test structure is a FET transistor implemented from a parasitic PNP transistor located between the isolation region and the base region of an isolated vertical NPN transistor.

4. A method according to claim 2, characterized in that $E_{ox}$, the equivalent thicknes of the oxide, is deducted from curve $I_D - V_G$ under saturation, which provides $E_{ox} = I(N_D)$ (16), and then $N_D = H(E_{ox})$ (11) is deducted by making two measurements on the threshold voltage corresponding to two source region voltages, the FET device being set into strong inversion, $E_{ox}$ and $N_D$ being computed by interactively deducing the intersection of the curves defined by the system of equations (11) and (16); $N_{SS}$ is computed from the slope of curve $I_D - V_G$ under weak inversion, and from the relation $N_{SS} = F(E_{ox}, N_D)$ (5) in terms of $E_{ox}$ and $N_D$; $N_{eff}$ is computed from a measurement of the threshold voltage for a determined source region voltage and from the relation $N_{eff} = G(E_{ox}, N_D)$ (9) in terms of $E_{ox}$ and $N_D$.

* * * * *